(12) United States Patent
Lin (10) Patent No.: US 7,978,102 B1
(45) Date of Patent: Jul. 12, 2011

(54) MULTI-BIN CABAC DECISION BIN DECODER

(75) Inventor: Chien-Chang Lin, Tainan County (TW)

(73) Assignee: Himax Media Solutions, Inc., Fonghua Village, Xinshi Dist., Tainan (TW)

( * ) Notice: Subject to any disclaimer, the term of this patent is extended or adjusted under 35 U.S.C. 154(b) by 0 days.

(21) Appl. No.: 12/719,867

(22) Filed: Mar. 9, 2010

(51) Int. Cl.
*H03M 7/00* (2006.01)

(52) U.S. Cl. ......... 341/107; 375/240; 708/490; 382/239

(58) Field of Classification Search ............ 341/60–144; 382/239; 375/240.25, 240.12, 240.01, 240, 375/E7.093, E7.144, E7.199, E7.211, E7.231, 375/E7.226; 708/490
See application file for complete search history.

(56) References Cited

U.S. PATENT DOCUMENTS

| | | | | |
|---|---|---|---|---|
| 6,049,399 A * | 4/2000 | Shyu | ............................ | 358/520 |
| 6,256,653 B1 * | 7/2001 | Juffa et al. | .................... | 708/290 |
| 6,327,005 B1 * | 12/2001 | Han | ............................... | 348/714 |
| 6,362,831 B1 * | 3/2002 | Shyu | ............................. | 345/600 |
| 6,611,241 B1 * | 8/2003 | Firester et al. | ................. | 345/1.3 |
| 6,781,529 B1 * | 8/2004 | Lin et al. | ........................ | 341/106 |
| 6,798,240 B1 * | 9/2004 | Pedersen | ......................... | 326/39 |
| 6,856,701 B2 * | 2/2005 | Karczewicz et al. | ......... | 382/247 |
| 6,943,580 B2 * | 9/2005 | Lewis et al. | ..................... | 326/40 |
| 6,995,694 B1 * | 2/2006 | He et al. | .......................... | 341/58 |
| 7,055,018 B1 * | 5/2006 | Bratt et al. | ........................ | 712/4 |
| 7,199,733 B2 * | 4/2007 | Chi et al. | ......................... | 341/67 |
| 7,262,722 B1 | 8/2007 | Jahanghir | | |
| 7,804,903 B2 * | 9/2010 | Haque et al. | ............. | 375/240.25 |

* cited by examiner

*Primary Examiner* — Lam T Mai
(74) *Attorney, Agent, or Firm* — Winston Hsu; Scott Margo (57) ABSTRACT

A binary arithmetic decoding device may include a first and second lookup table each receive signal output from a first register. A third lookup table receives signal output from the first lookup table and a fourth lookup table receives signal output from the second lookup table. A first multiplexer receives signal output from the third and fourth lookup tables. A second multiplexer receives signal output from the first and second lookup tables and from the second lookup table where the first and second multiplexers are controlled by a same first signal. The proposed decoder may further include a second register, a first adder, a third adder, and a first comparison module coupled in series and output of the first comparison module is the first signal.

12 Claims, 8 Drawing Sheets

FIG. 8

MULTI-BIN CABAC DECISION BIN DECODER

BACKGROUND OF THE INVENTION

1. Field of the Invention

The present disclosure relates generally to a multi-bin CABAC decoder, and more specifically to a 2 decision bin CABAC decoder with a shortened critical path to improve timing.

2. Description of the Prior Art

The Context-adaptive Binary Arithmetic Coding (CABAC) decoding algorithm is basically sequential computations to calculate range, offset, and lookup tables for context variables. The data dependence of CABAC decoding makes it difficult to achieve high decoding throughput resulting in the CABAC decoding complexity required to process high definition images in real time to be about 3 giga-operations per second. Basically, a CABAC decoder includes a decision bin decoder and a bypass bin decoder. By experiment, 80%-90% of all bins are encoded as decision bins, and the remaining bins are encoded as bypass bins. Unlike other video coding tools in H.264/AVC, although it has been done as disclosed in U.S. Pat. No. 7,262,722 issued to Jahanghir et al. and included herein in its entirety by reference, it is difficult to enhance the CABAC decoding using a parallel architecture to improve the performance. Therefore, due to the sequential order decoding, the CABAC decoding becomes a major bottleneck in H.264/AVC.

SUMMARY OF THE INVENTION

A binary arithmetic decoding device that includes a 2 decision bin decoder is proposed. The proposed decoder may include a first and second lookup table each receiving signal output from a first register. A third lookup table receives signal output from the first lookup table. A fourth lookup table receives signal output from the second lookup table. A first multiplexer receives signal output from the third lookup table and from the fourth lookup table. A second multiplexer receives signal output from the first lookup table and from the second lookup table where the first and second multiplexers are controlled by a same first signal. The proposed decoder may further include a second register, a first adder, a second adder, and a first comparison module coupled in series and output of the first comparison module is the first signal.

The proposed decoder may also further include a third multiplexer receiving output from the second multiplexer via a third register. A fifth and sixth lookup table each receive signal output from the third multiplexer. A seventh lookup table receives signal output from the fifth lookup table. An eighth lookup table receives signal output from the sixth lookup table. A fourth multiplexer receives signal output from the seventh lookup table and from the eighth lookup table. A fifth multiplexer receives signal output from the fifth lookup table and from the sixth lookup table. The fourth and fifth multiplexers are controlled by a same second signal. The output from the fifth multiplexer may be stored in the first register. The proposed decoder may further include a third adder, a fourth adder, and a second comparison module coupled in series and output of the second comparison module is the second signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
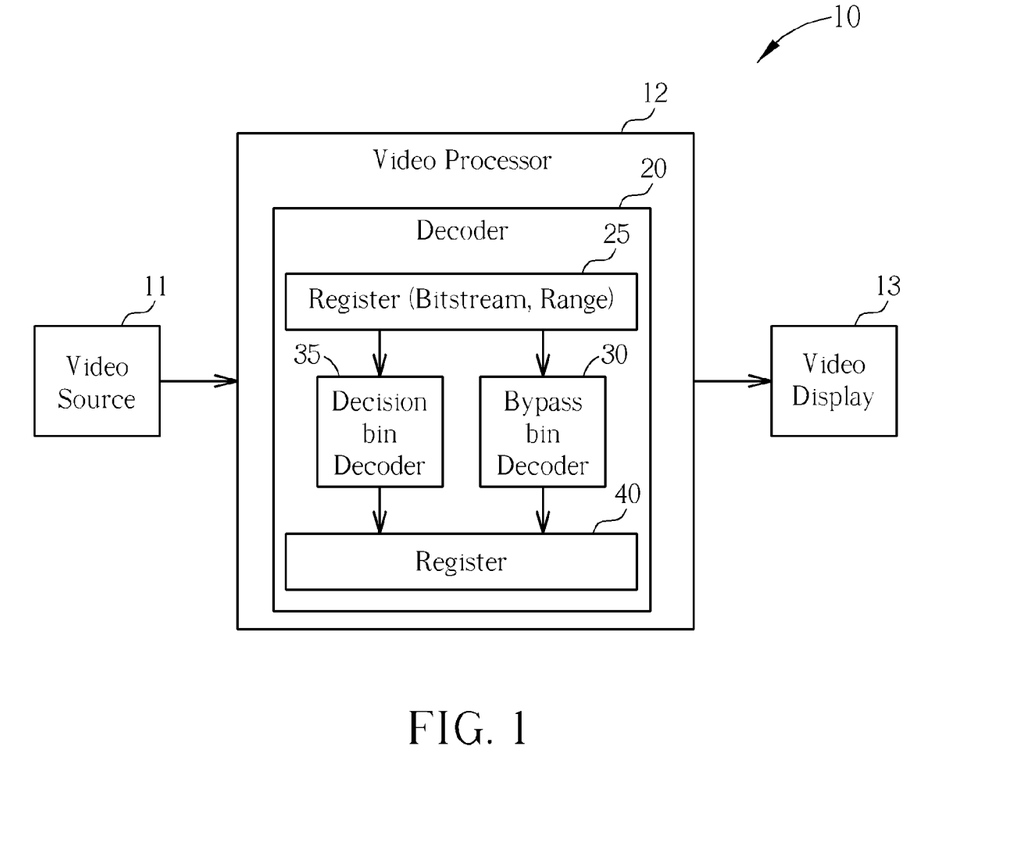
FIG. 1 is a block diagram of a video processing system.

FIG. 1 is a block diagram of a video processing system 10 suitable to take advantage of the multi-decision bin decoder disclosed herein. The video processing system 10 includes a video source 11, which may be a reproduced or transmitted video signal that may have been compressed and/or encoded using the well known H.264/AVC standard employing context-based adaptive binary arithmetic coding (CABAC) techniques. The H.264/AVC signal may be output from the video source 11 to a video processor 12 for decoding and reassembly into the original video signal before being output by the video processor 12 to a video display 13 for viewing.

The video processor 12 may include a processor for controlling operations of the video processor 12, a decoder 20 for performing the actual decoding of the inbound video signal, and a memory for temporary storage of the video signal, as storage for data and/or lookup tables used internally during the decoding process, and for use as a workspace, as well as necessary busses and connections between the components. The decoder may comprise one or more registers 25, 40, a decision bin decoder 35, and a bypass bin decoder 30.

Figure 2:
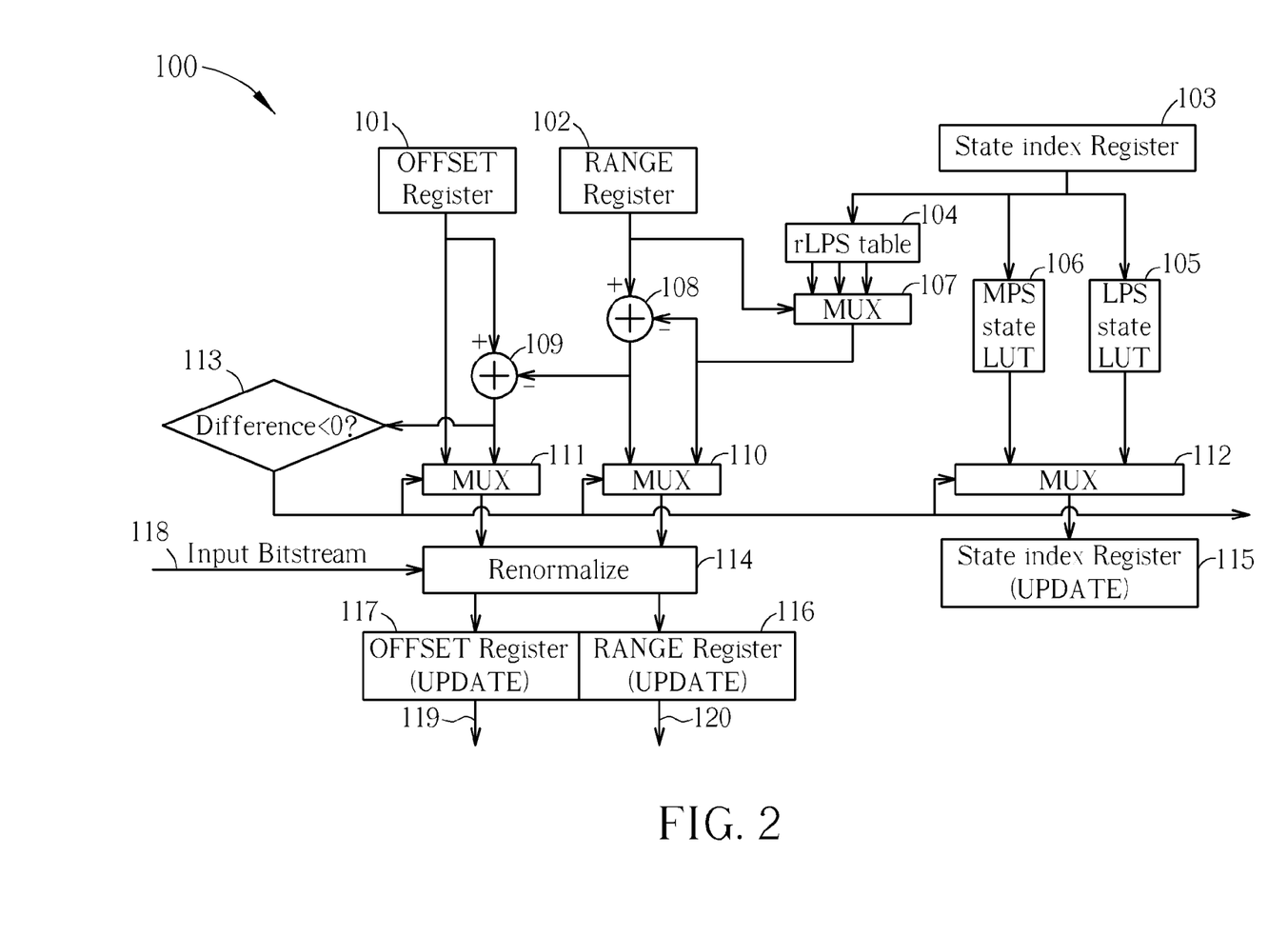
FIG. 2 illustrates a decision bin decoder for use in the video processing system of FIG. 1.

FIG. 2 illustrates a 1 decision bin-per-cycle bin decoder 100 suitable for use in the video processing system 10. The bin decoder 100 may comprise an Offset Register 101, a Range Register 102, and a State index Register 103. Information stored within the Offset Register 101, Range Register 102, and State index Register 103 may be inputted from the register 25 of the decoder 20 or said registers 101, 102, 103 may be part of the register 35 in some embodiments. The State index Register 103 outputs the current context state to be used to access appropriate values in a rLPS lookup table 104 (reference least probable state), a MPS state lookup table 106 (most probable state), and an LPS state lookup table 105 (least probable state). The MPS from the MPS state lookup table 106 and the LPS from the LPS state lookup table 105 are each inputs to a multiplexer 112. The rLPS lookup table 104 outputs possible reference states to a multiplexer 107 that is controlled by output from the Range Register 102. The output of the multiplexer 107 is sent to an adder 108 to be subtracted from the current range output from the Range Register 102. Output of the multiplexer 107 is also received as an input by multiplexer 110. Output of the adder 108 is transmitted as a second input to the multiplexer 110 and to a second adder 109 to be subtracted from output from the Offset Register 101. Output from the Offset Register 101 is also sent to a multiplexer 111, as is the difference output from the adder 109.

The difference output from the adder 109 is sent through a comparison module 113 for determination whether the difference is less than zero. The result of the determination is used to control the multiplexers 111, 110, and 112. Output of the Multiplexer 112 is then used to update the State index register 115.

The input Bitstream 118 and outputs of the multiplexers 111 and 110 are each sent to a renormalize module 114, which in turn updates the Offset Register 117 and the Range Register 116 (which respectively output the updated values 119 and 120 to be used, along with the updated State index Register 115, in the next decoding cycle.

Figure 3:
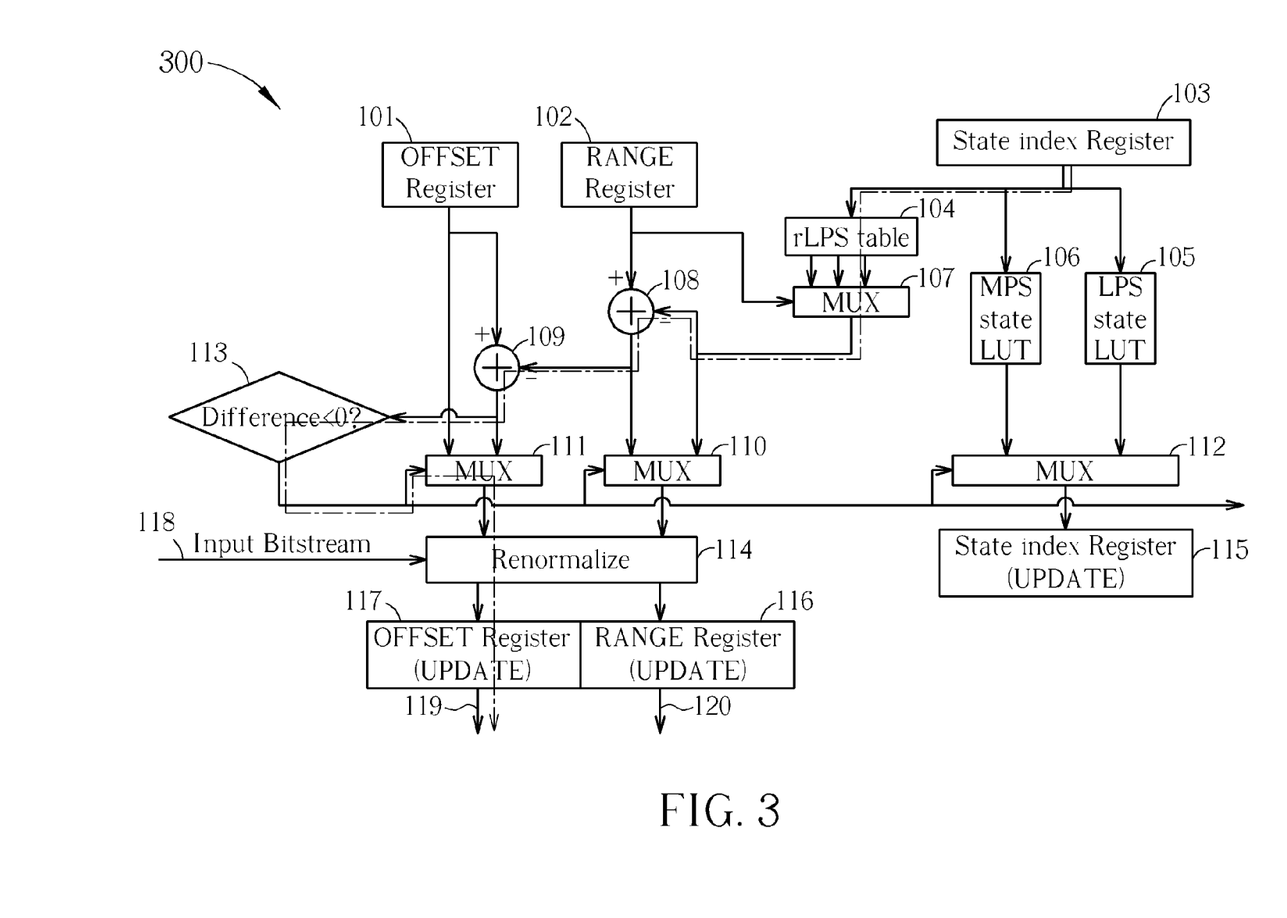
FIG. 3 shows the critical path of the decision bin decoder shown in FIG. 2.

The bin decoder 300 of FIG. 3 is quite similar to the bin decoder 100 of FIG. 2 and is included to show how the critical path of such a 1 bin-per-cycle decoder becomes a design issue. As shown in FIG. 3, the critical path of the 1 bin-per-cycle decoder 300 begins with the output from the State index Register 103 to the rLPS lookup table 114. According to the control input (received from the Range Register 102) of the multiplexer 107, one of the values of the rLPS lookup table 114 is routed via the multiplexer 107 to be subtracted from the output of the Range register 108 in the adder 108. The critical path then continues with the output of the adder 108 being subtracted from the current offset output by the Offset Register 101 in the adder 109. Output of the adder 109 is then fed to the comparison module 113, and the output of the comparison module 113 controls the multiplexer 111. Output of the multiplexer 111 is fed to the Renormalize module 114, resulting in updating the Offset Register 117. Unfortunately, while functional, throughput of the 1 bin-per-cycle bin decoders 300, 400 is not high enough for real time decoding of H.264/AVC video, especially if in high definition.

Figure 4:
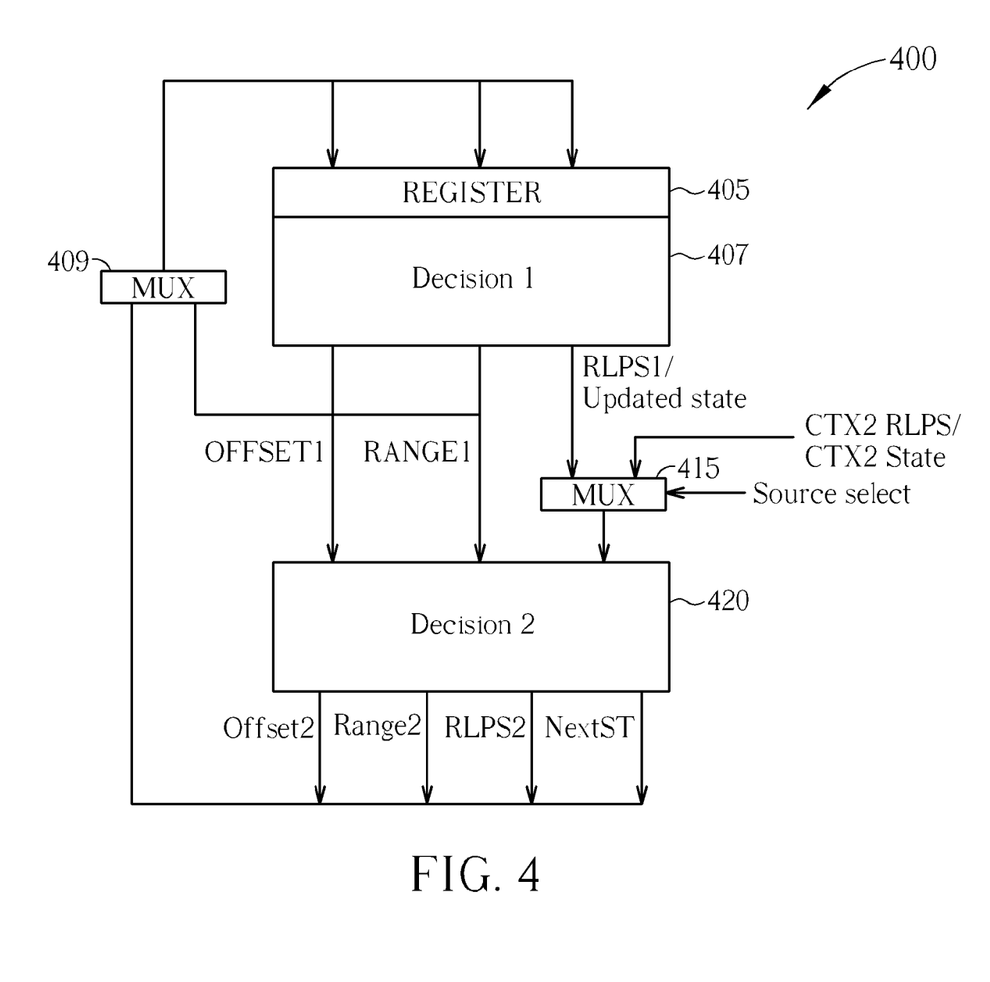
FIG. 4 provides an overview of a decision bin decoder according to an embodiment of the disclosure.

To increase the throughput, a 2 bin decoder 400 as shown in FIG. 4 may be used which can decode 1 or 2 bins-per-cycle. FIG. 4 is a rough block diagram of the proposed 2 bin decoder that may include a register 405 coupled to the first decision bin decoder 407. Offset1, Range1, and RLPS1 with the updated state are output from the first decision bin decoder 407, with Offset1 and Range1 being input directly into a second decision bin decoder 420 while the RLPS signal inputs to a multiplexer 415 along with an externally fed CTX2 RLPS/CTX2 state signal. The multiplexer 415 is controlled by a Source select signal and the resulting output of the multiplexer 415 is transmitted to the second decision bin decoder 420. Outputs from the second decision bin decoder 420, Offset2, Range2, RLPS2 and NextST, are each fed to a multiplexer 409 along with the RLPS1 signal from the first decision bin decoder 407. Output of the multiplexer 409 feeds the respective signals back into the register 405 so that another cycle may begin.

Although a 2 bin-per-cycle decision bin decoder will have an acceptable throughput level for H.264/AVC HD video, again the critical path becomes an issue and can be reduced by rescheduling the decoding flow and moving the lookup tables to the previous stage. The 2 bin-per-cycle decision bin decoder may be implemented according to FIG. 5 which shows the first decision bin decoder 500 and FIG. 6 which shows the second decision bin decoder 600 along with connections between the two.

Figure 5:
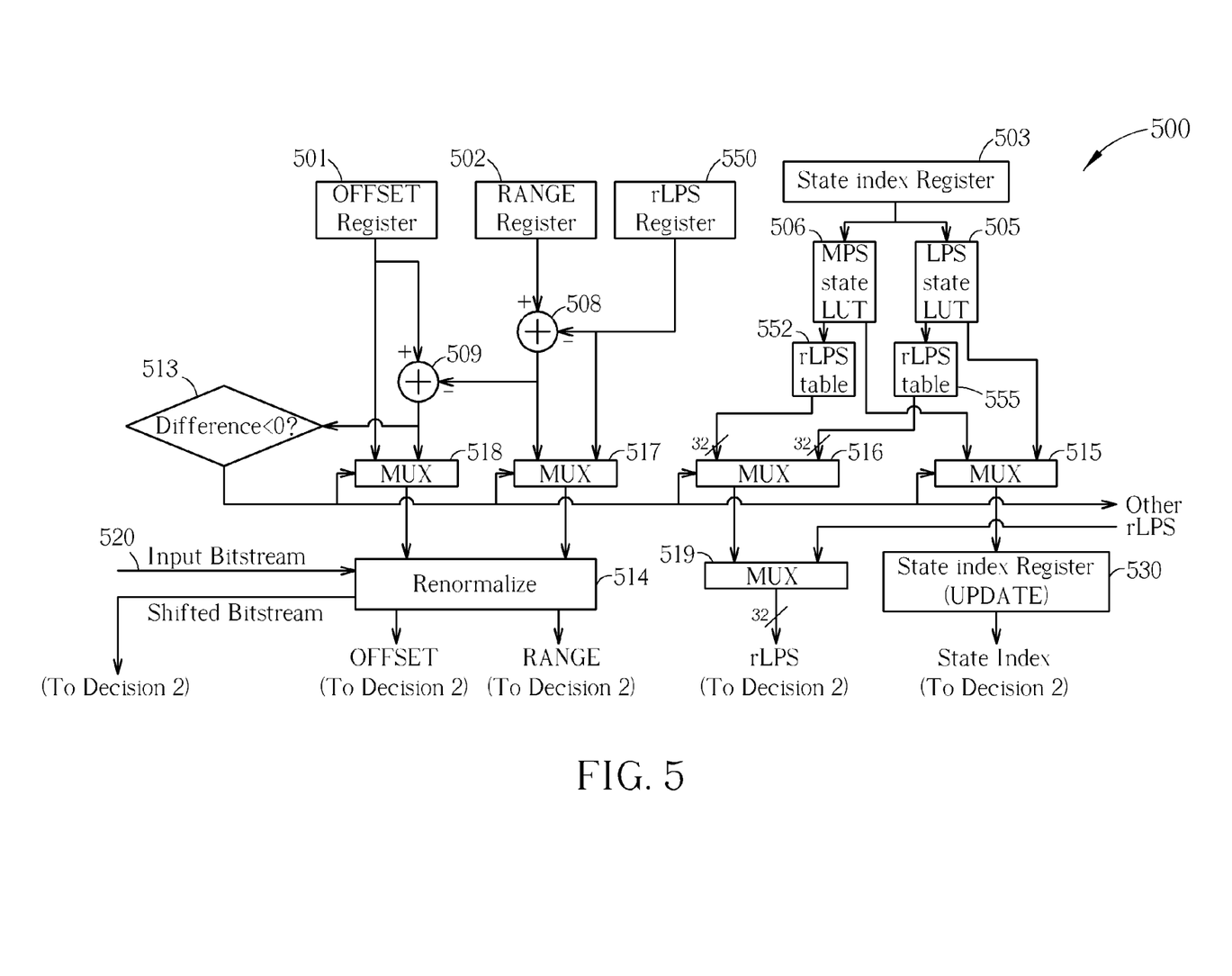
FIG. 5 and FIG. 6 illustrate detailed architecture of the decision bin decoder shown in FIG. 4.

Referring to FIG. 5, the first decision bin decoder 500 may comprise an Offset Register 501, a Range Register 502, an rLPS Register 550, and a State index Register 503. The State index Register outputs the current state to each of a MPS state lookup table 506 and a LPS state lookup table 505. The selected MPS output from the MPS state lookup table 506 is fed as an input to each of a first rLPS lookup table 552, which outputs a 32 bit signal to a multiplexer 516, and to a multiplexer 515. The selected LPS output from the LPS state lookup table 505 is fed as an input to each of a second rLPS lookup table 555, which outputs a 32 bit signal to the multiplexer 516, and to a multiplexer 515.

Output of the rLPS Register 550 is fed to a multiplexer 517 and is also subtracted from output of the Range Register 502 by an adder 508. Output of the adder 508 is transmitted as a second input to the multiplexer 517 and to an adder 509. Output of the Offset Register 501 is transmitted to a multiplexer 518 and to the adder 509. The adder 509 subtracts the signal issued by the adder 508 from the signal issued by the Offset Register 501 and sends the difference as a second input to the multiplexer 518 and to a comparison 513 module which determines whether the difference is less than zero. The comparison module 513 outputs the result of the determination as a control signal to each of the multiplexers 518, 517, 516, and 515.

Figure 6:
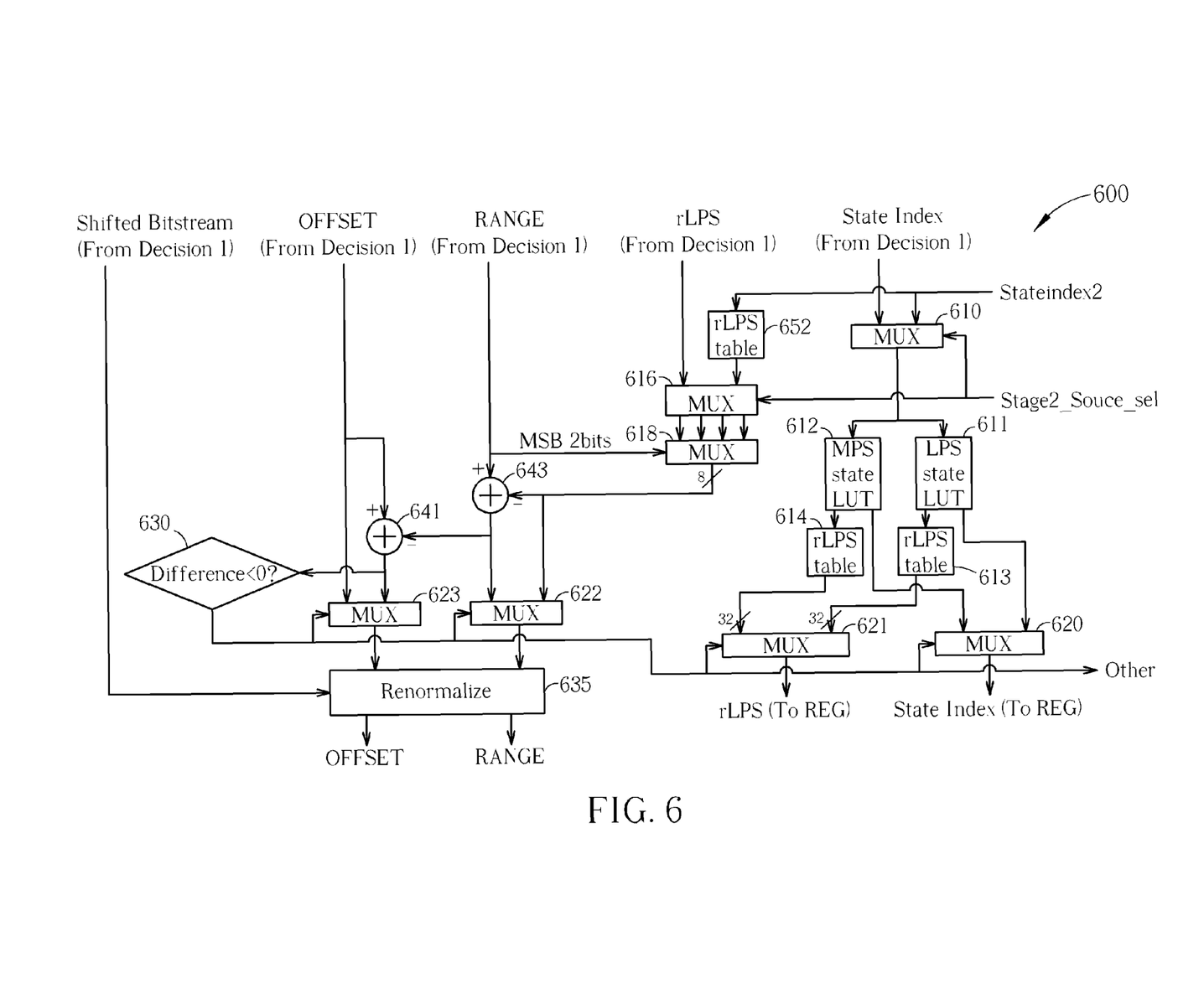

Output of the multiplexer 515 then updates a State index Register 530, which in turn outputs the updated state to a multiplexer 610 of the second decision bin decoder 600 shown in FIG. 6. Similarly, output of the multiplexer 516 is fed to a multiplexer 519 which may receive signal from another rLPS as input. A 32 bit rLPS signal is then output from multiplexer 519 to a multiplexer 616 of the second decision bin decoder 600. Input Bitstream 520, along with respective outputs of the multiplexers 518 and 517 are transmitted to a Renormalize module 514, which outputs a shifted bitstream to Renormalize module 635, an Offset signal to a multiplexer 632 and to an adder 641, and a Range signal to an adder 643 with the 2 most significant bits also functioning as a control signal for a multiplexer 618 as shown in FIG. 6.

Turning now more specifically to FIG. 6, the second decision bin decoder 600 further takes as input a StateIndex2 signal which is fed as a second input to the multiplexer 610 and to an rLPS lookup table 652. Output from the rLPS lookup table 652 becomes a second input to the multiplexer 616 (along with the rLPS signal from the multiplexer 519 of decision bin decoder 500). A Stage2_Source_Sel signal serves as a control signal for both multiplexers 610 and 616.

Output from the multiplexer 610 goes to each of a MPS state lookup table 612 and an LPS state lookup table 611. The selected state output from the MPS state lookup table 612 is fed to both a multiplexer 620 and to a first rLPS lookup table 614, which in turn outputs a 32 bit signal as input to a multiplexer 621. The selected state output from the LPS state lookup table 611 is fed to both the multiplexer 620 and to a second rLPS lookup table 613, which in turn outputs a 32 bit signal as a second input to the multiplexer 621.

The multiplexer 616 outputs 4 8-bit signals (according to the Stage2_Source_Sel control signal) to a multiplexer 618, which under the control of the 2 MSB signal from the Renormalize module 514, outputs a single 8-bit signal to the adder 643 and to a multiplexer 622. The adder 643 subtracts the single 8-bit signal from the multiplexer 618 from the Range signal from the Renormalize module 514 and outputs the difference to a multiplexer 622 and to the adder 641. The adder 641 subtracts the difference from the adder 643 from the Offset signal output by the Renormalize module 514 and outputs the difference as input to the multiplexer 623 and to a comparison module 630. The comparison module 630 determines whether the difference output by the adder 641 is less than zero and outputs a result of the determination that is used as a control signal for each of the multiplexers 623, 622, 621, and 620. The Renormalize module 635 of the second decision bin decoder 600 receives the shifted Bitstream from the renormalize module 514 of the first decision bin decoder 500, and the respective outputs of each of the multiplexers 623 and 622, and respectively outputs an Offset signal and a Range signal to be used by the Offset Register 501 and Range Register 502 of the first decision bin decoder 500 during the next cycle. Similarly, outputs of the multiplexers 621 and 620 are also respectively sent to the rLPS Register 550 and the State index Register 503 to be used by the first decision bin decoder 500 during the next cycle.

Figure 7:
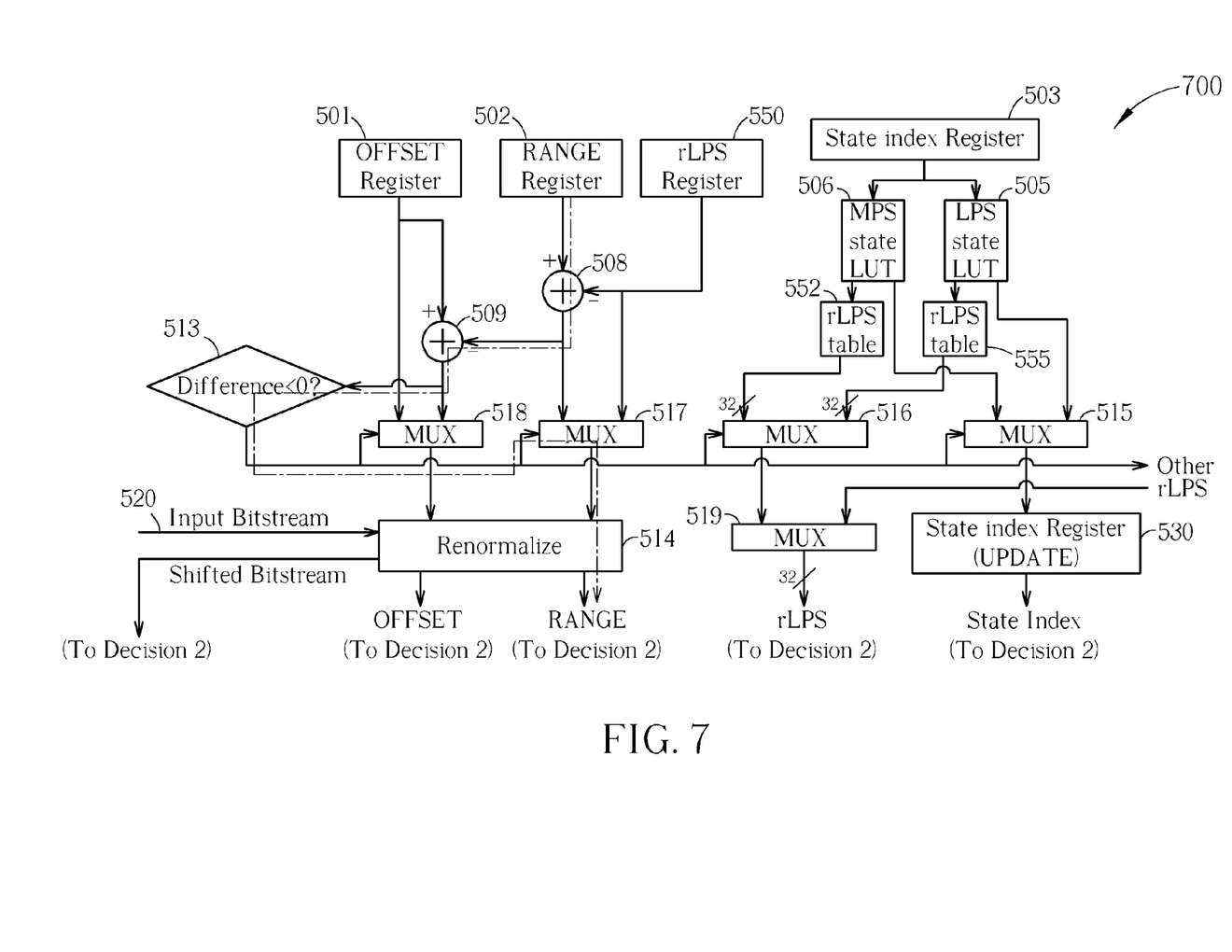
FIG. 7 and FIG. 8 show the critical path of the decision bin decoder of FIG. 5 and FIG. 6.
Figure 8:
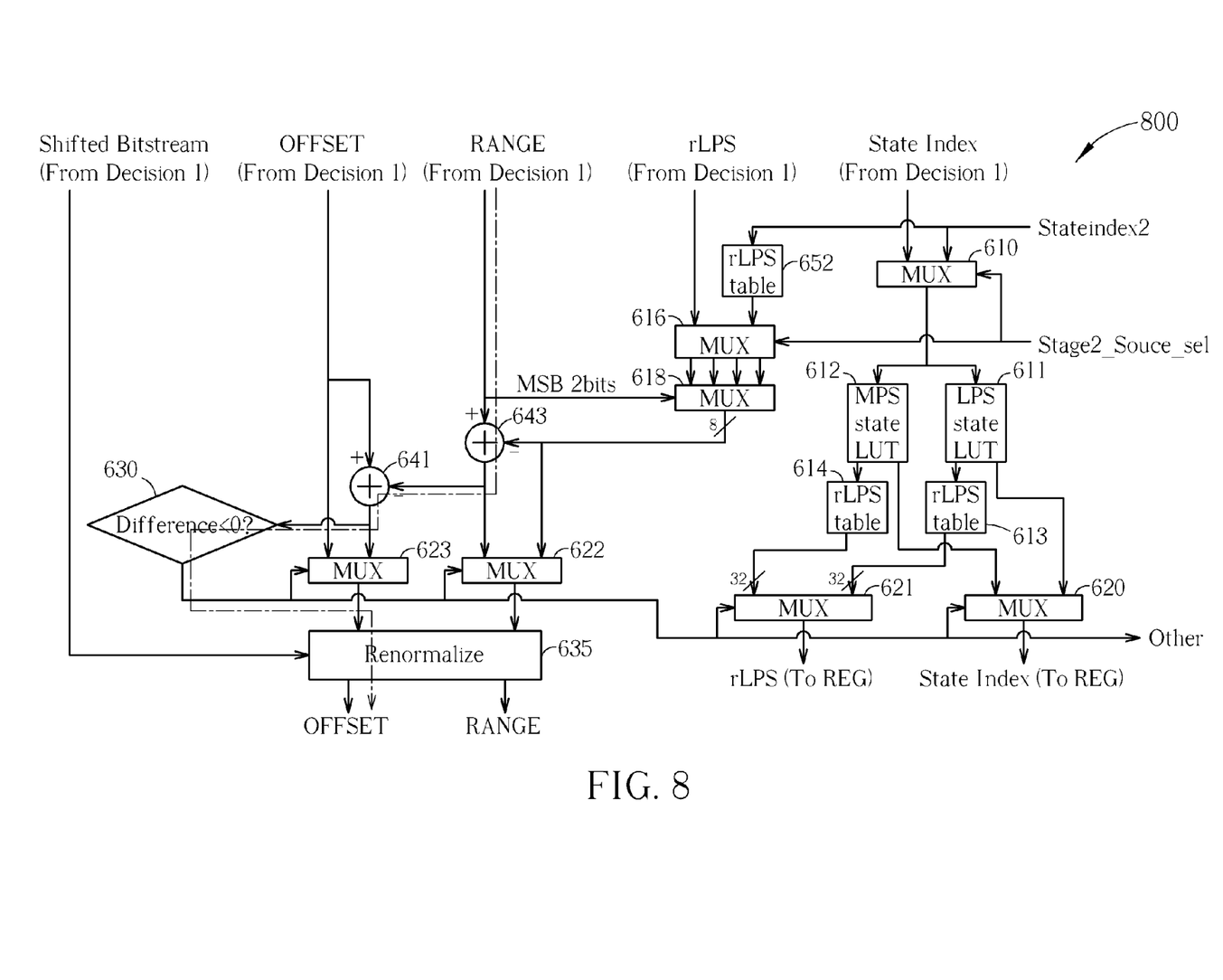

FIG. 7 and FIG. 8 are included here to aid in understanding of the present disclosure by showing the critical path of the 2 bin decision decoder 500/600. As shown in FIG. 7 and FIG. 8 The proposed 2 bin decision decoder 500/600 has a critical path beginning with the Range Register 502 outputting to the adder 508 with the result sent to the adder 509. From the adder 509, the critical path continues to the comparison module 513, which subsequently controls the output of the multiplexer 517, whose output transfers the needed range to the adder 643 via the Renormalize module 514. From the adder 643, the critical path continues to the adder 641 followed by the comparison module 630. Output of the comparison module 630 controls the multiplexer 623 to output the Offset needed for the next cycle via the renormalize module 635.

Compared to conventional designs, the critical path of a 2 bin-per-cycle decoder is longer than that of a 1 bin-per-cycle design. The present disclosure recognizes that rescheduling the decoding flow and moving the lookup tables is a suitable solution to minimize length of the critical path. The proposed design can show a 33% improvement in time requirements. For example, before improvement, the frequency of a 2 bin per cycle decoder is 150 Mhz (Fujitsu 90 nm), while after the rescheduled decoding flow is applied, the frequency can be raised to 225 Mhz, improving performance.

Those skilled in the art will readily observe that numerous modifications and alterations of the device and method may be made while retaining the teachings of the invention.

What is claimed is:

1. A binary arithmetic decoding device comprising:
    a first and second lookup table each coupled to receive signal output from a first register;
    a third lookup table coupled to receive signal output from the first lookup table;
    a fourth lookup table coupled to receive signal output from the second lookup table;
    a first multiplexer coupled to receive signal output from the third lookup table and from the fourth lookup table; and
    a second multiplexer coupled to receive signal output from the first lookup table and from the second lookup table;
    wherein the first and second multiplexers are controlled by a same first signal.

2. The binary arithmetic decoding device of claim 1 further comprising a second register, a first adder, a second adder, and a first comparison module coupled in series and output of the first comparison module is the first signal.

3. The binary arithmetic decoding device of claim 1 further comprising:
    a third multiplexer coupled to receive output from the second multiplexer via a third register;
    a fifth and sixth lookup table each coupled to receive signal output from the third multiplexer;
    a seventh lookup table coupled to receive signal output from the fifth lookup table;
    an eighth lookup table coupled to receive signal output from the sixth lookup table;
    a fourth multiplexer coupled to receive signal output from the seventh lookup table and from the eighth lookup table; and
    a fifth multiplexer coupled to receive signal output from the fifth lookup table and from the sixth lookup table;
    wherein the fourth and fifth multiplexers are controlled by a same second signal.

4. The binary arithmetic decoding device of claim 3 wherein output from the fifth multiplexer is stored in the first register.

5. The binary arithmetic decoding device of claim 3 further comprising a third adder, a fourth adder, and a second comparison module coupled in series and output of the second comparison module is the second signal.

6. The binary arithmetic decoding device of claim 5 further comprising a sixth multiplexer coupled to receive input from the first multiplexer.

7. The binary arithmetic decoding device of claim 6 further comprising a seventh multiplexer coupled to receive outputs from the sixth multiplexer and from a ninth lookup table and to output to an eighth multiplexer.

8. The binary arithmetic decoding device of claim 7 wherein the third multiplexer and the eighth multiplexer are controlled by a same third signal.

9. The binary arithmetic decoding device of claim 7 wherein output of the eighth multiplexer is transmitted as input to the third adder.

10. The binary arithmetic decoding device of claim 7 further comprising a fourth register coupled to output signal to the second adder and to an ninth multiplexer.

11. The binary arithmetic decoding device of claim 10 further comprising a fifth register coupled to output signal to the first adder and to a tenth multiplexer.

12. The binary arithmetic decoding device of claim 11 further comprising a renormalize module coupled to receive an inputted bitstream and respective outputs from the ninth and tenth multiplexers, and to output respectively to the third and fourth adders.

* * * * *